US 7,760,106 B2

(12) United States Patent
Vandensande et al.

(10) Patent No.: US 7,760,106 B2
(45) Date of Patent: Jul. 20, 2010

(54) POWER CELL MONITORING

(75) Inventors: Geert Vandensande, Berbroek (BE);
Bernard Gentinne, Brussels (BE);
Francois Laulanet, Brussels (BE)

(73) Assignee: Semiconductor Components Industries, L.L.C., Phoenix, AZ (US)

( * ) Notice: Subject to any disclaimer, the term of this patent is extended or adjusted under 35 U.S.C. 154(b) by 480 days.

(21) Appl. No.: 11/955,234

(22) Filed: Dec. 12, 2007

(65) Prior Publication Data
US 2008/0143543 A1  Jun. 19, 2008

(30) Foreign Application Priority Data
Dec. 13, 2006  (GB)  .................................. 0624858.7

(51) Int. Cl.
*G08B 21/00*  (2006.01)
(52) U.S. Cl. ..................... 340/636.1; 340/635; 340/331; 340/332; 340/326; 340/474; 340/662; 340/691.1; 340/692; 320/118; 320/128; 320/132; 320/136; 320/162; 324/426; 324/429; 324/522; 702/63
(58) Field of Classification Search .............. 340/636.1, 340/635, 331, 332, 326, 474, 662, 691.1, 340/692; 320/118, 128, 132, 136, 162; 324/426, 324/429, 522; 702/63
See application file for complete search history.

(56) References Cited

U.S. PATENT DOCUMENTS 7,098,626 B2 *  8/2006  Seo et al. ..................... 320/150
7,218,078 B2 *  5/2007  Gagnon et al. .............. 320/132

\* cited by examiner

*Primary Examiner*—Tai T Nguyen
(74) *Attorney, Agent, or Firm*—Adrian James Lee

(57) ABSTRACT

The invention relates to a signaling system for use in a system for monitoring and/or controlling a stack of power cells. The stack of power cells is series connected, i.e. the negative terminal of one power cell is connected to the positive electrode of the adjacent power cell. A monitoring device is associated with each power cell to monitor characteristics of the power cell (temperature, voltage). Every monitoring device is powered by the power cell it is associated. The monitoring device monitors the status of the cell (e.g. it measures the difference of potential between the positive terminal and the negative terminal of that cell but it may also measure the temperature of the power cell, the pH of the electrolyte if the power cell Ci is a battery, etc. and communicates information on the status of the cell to other monitoring devices. The monitoring devices are daisy chained. Data cannot be exchanged between a monitoring device from one cell and a monitoring device from another cell without that the data sent by the one device transits by the other devices in the chain.

12 Claims, 11 Drawing Sheets

POWER CELL MONITORING

CROSS-REFERENCE TO RELATED APPLICATIONS

This patent application claims the benefit of British Patent Application Serial No. 0624858.7, filed Dec. 13, 2006, which patent application is incorporated herein by reference in its entirety.

DESCRIPTION

The present invention relates to power cells and methods of manufacturing and operating power cells. In particular the invention relates to a signaling system and method that is applicable for use in a system for monitoring and/or controlling a stack of power cells, e.g. of a battery.

DESCRIPTION OF THE RELATED ART

Monitoring of individual battery elements or group of battery elements in a set of series connected batteries or series connected group of batteries is known from the art.

U.S. Pat. No. 6,891,352 describes a battery apparatus for controlling battery modules connected in series, the battery apparatus to be used for electric car or hybrid electric car. So called lower order control devices control battery modules having plural battery cells connected in series. Data is exchanged between lower order control devices and a so called high order control device that gives instructions to the lower order control devices.

A lower order control device draws power from the battery module it monitors. Data is transmitted from the high order control device to any of the lower order control device through a daisy chain. A first lower order control device receives data from the high order control devices through an opto-insulator (also known as photocouplers or opto-isolators). The message received may be relayed to a second lower order control device without the need for an opto-isolator, that in turn may relay the message to a third lower order control device and so on. The lower order control devices operating at different voltages, problems may arise when transmitting data from one lower order control device to another. To overcome that problem without use of an opto-insulator for isolating two successive lower order control devices, the configuration adopted in U.S. Pat. No. 6,891,352 to connect two adjacent lower order control devices relies on the establishment of a current loop between said two adjacent lower order control devices. On the daisy chained seen on FIG. 1 of U.S. Pat. No. 6,891,352, the communication takes place from the top-low order control device IC-1 to the bottom low order control device IC-3. The device IC-1 sources a current from VDD to an output Out-1. Device IC-2 will receive this current at its input In-1. The voltage swing at the output Out-1 is defined by the components in device IC-1 and the components in device IC-2. Matching of the components between these 2 different devices will determine the signal amplitude. The diodes used as protection act as rectifiers and affects the EMC-performance of the device. Such implementation is not desired in a harsh automotive environment.

In battery monitoring systems, it is important that every battery modules sees the same electrical load. This is important to keep the same condition for every battery module so that no battery module will be discharged faster then the other battery modules. This is not the case in the U.S. Pat. No. 6,891,352 patent. Indeed, the top battery module (VB1, VB2, VB3, VB4) supplying the control device IC-1 has an extra load in the form of opto-couplers F1, F2, F3 and the associated pull-up resistors RF1, RF2, RF3. The battery module (VB5, VB6, VB7, VB8) is loaded by the control device IC-2 only while the bottom battery module (VB9, VB10, VB11, VB12) is loaded by the control device IC-3 as well as by the opto-couplers F4, F5, F6. This problem will be solved by the invention.

WO 00/05596 describes a battery monitoring apparatus to monitor a number of series connected battery cells. The battery monitoring apparatus comprises a central battery monitoring system for monitoring the series connected battery cells as a whole and a number of cell monitoring devices for monitoring one or more battery cells and a communication link for connecting the cell monitoring devices in a daisy chain configuration to the central battery monitoring system. As in U.S. Pat. No. 6,891,352 each said cell monitoring device is powered by the battery cells it monitors and as a consequence, two monitoring devices will usually operate at different voltages. Be VCC1 the positive supply voltage of a first monitoring device and GND1 the negative supply voltage of that first monitoring device. Be VCC2 the positive supply voltage of a second monitoring device adjacent to said first monitoring device and GND2 the negative supply voltage of that second monitoring device. The supplies of the monitoring devices are "stacked", i.e. VCC1>GND1=VCC2>GND2. The first and second monitoring devices operate at different voltage levels. When the voltage differences become important, it may become impossible to transmit messages from the first monitoring device to the second without opto-insulator. In order not to have to use opto-isolators (or any other component that allows the transmission of data while guaranteeing galvanic isolation), WO 00/05596 proposes to use level shifters to transmit messages between two adjacent monitoring devices. For down-link messages, i.e. messages sent by the first monitoring devices to the second monitoring devices operating at a lower potential than the first, a micro-controller in the first monitoring devices controls the gate of a MOSFET Q. The source of P-MOSFET Q is connected to VCC1, the highest supply voltage of the first monitoring device, while the drain of P-MOSFET Q is connected to GND2, the lowest supply voltage of the second monitoring device, via three series connected resistors R1, R2 and R3. R1 is directly connected to the drain of P-MOSFET Q, R3 is directly connected to GND2, the lowest supply voltage of the second monitoring device and R2 connects R1 to R3.

The voltage drop across resistor R3 is monitored by a comparator COMP2 that compares said voltage drop with a reference voltage VREF2 higher than GND2 but lower than VCC2 (GND2<VREF2<VCC2). In operation, when the micro-controller in the first monitoring device outputs zero voltage on the gate of P-MOSFET Q (zero voltage between gate and source), no current is allowed to flow from the source electrode to the drain electrode of P-MOSFET Q and therefore open-circuits the connection between VCC1 and GND2. The voltage drop across resistor R3 is approximately zero volts and is applied to a first input of COMP2 to be compared with VREF2. COMP2 is supplied by VCC2 and GND2.

When the micro-controller in the first monitoring device output a voltage high on the gate of P-MOSFET Q (high voltage between source and gate), P-MOSFET Q is switched on and a current flows from VCC1 through resistors R1, R2 and R3 to the ground GND2 of the second cell monitoring device. As a result, the voltage (VCC1−GND2)×(R3)/(R1+R2+R3) is applied to the first input of COMP2 to be compared with VREF2. Provided the value of VREF2 is between the voltage levels applied to the first input of comparator COMP2 when P-MOSFET Q is switched ON and OFF, the output of comparator COMP2 will be a square wave signal varying in a voltage interval between the supply potentials GND2 and VCC2 of the second monitoring device. Therefore messages encoded within the variation of the signal applied to the gate of P-MOSFET Q are transferred from the first monitoring device to the second monitoring device.

One sees that the potential at the drain of P-MOSFET Q will vary between approximately VCC1 (when MOSFET Q is switched on) and GND2 (when MOSFET Q is switched off). Hence the voltage difference between drain and source of MOSFET Q will vary between 0 and (VCC1-GND2). The potential difference between VCC1 and GND2 will vary in function of the type of batteries being monitored as well as the number of battery cells monitored by each monitoring device. It will also vary in function of the level of charge of the battery elements. In practical applications, the difference of potential between VCC1 and GND2 may be higher than 60 volts. In those cases, the integration of the micro-controller and MOSFET Q on the same silicon substrate may become difficult or even impossible depending on the integration technologies available. It would therefore be beneficial to limit the voltage difference between the drain electrode and the source electrode of MOSFET Q in particular and any other transistor involved in the transmission of information between monitoring devices in general.

One also sees that provided the signals applied to the gate of MOSFT Q by the micro-controller in the first monitoring device vary between GND1 and VCC1, the difference of potential between the gate electrode and the source electrode of MOSFET Q will at least be equal to V(GND1)-V(GND2). If MOSFET Q is an n-type MOS and V(GND1)-V(GND2) is substantially higher than the threshold voltage of MOSFET Q, it will be impossible to switch MOSFET Q off. Current will continuously flow through MOSFET Q as well as resistors R1, R2 and R3. Since in any given technology, a MOSFET transistor has a given threshold voltage that may be lower than V(GND1)-V(GND2), it would be beneficial to limit the variation of potential of the source electrode of MOSFET Q in particular and any other transistor involved in the transmission of information between monitoring devices in general so that MOSFET Q can be switched off whatever the difference V(GND1)-V(GND2) might be.

Identification of the monitoring devices is important to allow detection of faulty battery cells and/or faulty monitoring devices by the central battery monitoring system.

While both U.S. Pat. No. 6,891,352 and WO 00/05596 recognize the interest of having identical lower order control devices/monitoring devices they do not propose a simple, reliable, practical and efficient method to identify the monitoring devices. In WO 00/05596 for instance, each cell monitoring device has its own identification or address set in advance by using DIP switches mounted in the device. DIP switches cannot be readily integrated on the same silicon substrate as the micro-controller and MOSFET Q. DIP switches are also set manually by a human operator; hence the proposed identification system is more prone to error than if identification of the monitoring devices was done automatically by the central battery monitoring system. It would be beneficial to find a solution that would not rely on a human operator and that could be easily integrated on the same semiconductor substrate as the micro-controller and MOSFET Q. There remains a need to improve the art.

SUMMARY OF THE INVENTION

An object of the present invention is to provide improved power cell arrangements. An advantage of at least some of the embodiments of the present invention is avoiding at least one of the problems identified in the prior art. First, in some embodiments it reduces the voltage difference between two electrodes of a transistor switch involved in the transmission of data between two monitoring devices that operate at different supply voltage levels. Embodiments of the invention can allow the integration on the same semiconductor substrate of most of the components necessary for a monitoring device, digital processing circuitry and/or microprocessor and/or micro-controller and/or analog to digital and digital to analog converters, voltage and current references, amplifiers, protection circuitry protecting against e.g. electrostatic discharges, reverse polarity, voltage surges, together with one or more transistor switches involved in the transmission of data between two monitoring devices operating at different supply voltage levels.

Embodiments of the invention can allow identification of a first monitoring device, said first monitoring device receiving data directly from a central monitoring device and the identification of any other device in the daisy-chain. The identification of the first device is based on a combination of signals generated by each monitoring devices. It does not require human intervention or components like DIP switches and allows the use of the same circuit, in particular integrated circuit, for any monitoring node. In particular, the identification of the first monitoring device in a chain of daisy chained monitoring devices makes use of the specificities of the communication interface that allows transmission of data between two monitoring devices operating at different supply voltage levels. The identification of the other devices is realized under control of the higher order device.

Thirdly, embodiments of the present invention can allow the use of communication protocols that are standard communication protocols for automotive applications.

The invention also guarantees that every battery cell in a stack of series connected battery cells will see the same load also when extra isolator-couplers (e.g an opto-isolator) are required for the communication (e.g. for the first monitoring device and the last monitoring device).

The invention relates to a signaling system that is applicable for use in a system for monitoring and/or controlling a stack of power cells. The power cells may be photovoltaic cells, thermo-photovoltaic cells, fuel cells, battery cells, as seen in FIG. 1, the stack of power cells comprises the power cells C1 (8), Ci-1 (12), Ci (13), Cn (14) that are series connected, i.e. the negative terminal $Ci-1^-$ of the power cell Ci-1 is connected to the positive electrode $Ci^+$ of the adjacent power cell Ci. The positive terminal $C1^+$ of the cell C1 is the positive terminal of the stack of power cells and the negative terminal $Cn^-$ of the cell Cn is the negative terminal of the stack of power cells.

A monitoring device CMi is associated with each power cell Ci to monitor characteristics of the power cell (temperature, voltage). Every monitoring device CMi is powered by the power cell Ci it is associated with, e.g. the positive supply terminal (1) of the device CMi is connected to the positive terminal $Ci^+$ of the power cell Ci and the negative supply terminal (2) of device CMi is connected to the negative terminal Ci- of the power cell Ci. Positive terminal $Ci^+$ and negative terminal Ci⁻ must be understood as meaning V(Ci⁺), the potential at the terminal Ci⁺, being higher than V(Ci⁻), the potential at the terminal Ci⁻.

The monitoring device CMi monitors the status of the cell Ci (e.g. it measures the difference of potential between the positive terminal Ci+ and the negative terminal Ci− of that cell but it may also measure the temperature of the power cell Ci, the pH of the electrolyte if the power cell Ci is a battery) and communicates information on the status of the cell Ci to other monitoring devices. In the present invention, the monitoring devices are daisy chained, the output port (4) of a monitoring device CMi−1 is connected to the input port (3) of the adjacent monitoring device CMi through a single wire (or communication link) (6). Data cannot be exchanged between a monitoring device CMi and a monitoring device CMi+k (with k>1) without that the data sent by the device CMi transit by the devices CMi+1, CMi+2, CM i+k−1 (i and k being integer numbers of course). In the following, we will use the terms monitoring devices, signaling devices or node indiscriminately to refer to a monitoring device CMi exchanging data with its neighboring monitoring devices CMi+1, as described throughout this document.

The potential at the positive electrode Ci⁺ (negative electrode Ci⁻) of a battery cell Ci varies in function of the index i, i.e. in function of the position of the cell in the stack, in a staircase fashion (see FIG. 2). As is evident from FIG. 2, the difference of potential between the positive supply voltage of a device CMi−1 and the negative supply voltage of an adjacent device CMi is the sum of the voltage differences seen by device CMi and CMi−1 respectively. This is not without consequences for the electronic components used to build the monitoring devices CM and in particular transistor switches involved in the data transmission from device to CMi−1 to device CMi.

In the prior art, adjacent devices operating at different supply voltages (different reference voltages), the voltage signals generated at the output terminal (4) of a device CMi−1 and applied at the input port (3) of device CMi may be lower than the negative supply terminal of device CMi−1, imposing voltage differences (i.e. electrical stresses) higher than V(Ci−1⁺)−V(Ci−1⁻), e.g. as high as V(Ci−1⁺)−V(Ci⁻). For the invention, the voltage swing for CMi−1 at the output (4) stays in the range of V(Ci−1⁺)−V(Ci−1⁻) and this valid for all cells in the daisy chain also for cell C1 and Cn. As such, every cell within the daisy chain will have the same voltage swing at their outputs independent of their place in the chain, and as a consequence, every output (4) for of the device CMi will give exactly the same load for the power cell Ci. The present invention proposes a signaling system that allows the transmission of data between adjacent monitoring devices CMi−1 and CMi while keeping the output (4) of the monitoring devices within operating margins contrary to solutions known to the art. This part of the invention simplifies the implementation of the output and makes the signaling more robust to disturbances in the harsh automotive environment.

The present invention proposes a signaling system for use with a plurality of power cells (Ci−1, Ci,) each cell having a different supply voltage interval ((V(Ci−), V(Ci+)) and each cell having its respective signaling device (CMi) and whereby each signaling device (CMi) is powered by the correspondent power cell (Ci), the signaling system comprising:

at least, an (i−1)th and a ith signaling device (CMi−1, CMi);

a communication link (6) for transmitting signals from an output terminal (4) of said (i−1)th signaling device (CMi−1) to an input terminal (3) of said ith signaling device (CMi); said communication link consisting of an electrical conducting connection; characterized in that said (i−1)th signaling device (CMi−1) comprises means (FIG. 6, Qi−1 16, Ra i−1 17) for varying the electrical potential at said output terminal (4) in dependence upon the signal to be transmitted;

said ith signaling device (CMi) comprises means for sensing, (comparator 27), via said communication link (6) and said input terminal (3), the variation of potential of said output terminal (4) and for outputting a signal (28) which varies in dependence upon the sensed variation of potential and that said ith signaling device (CMi) also comprising means for limiting the variation of electrical potential at the output terminal (4) of the (i−1)th signaling device to the supply voltage interval [V(Ci−1⁻), V(Ci−1⁺)] of said (i−1)th signaling device.

In particular, the means for limiting the variation of electrical potential at output terminal (4) of the (i−1)th signaling device (CMi−1) comprise a resistor Rbi (24) and a current source Srci(25).

According to another embodiment of the invention (FIGS. 4, 5), the output of at least one signaling device is powered by a supply voltage VCCi−1 and a local ground voltage GNDi−1, the supply voltage and the ground voltage being generated by a DC-DC voltage converter using the cell voltages V(Ci−1+) and V(Ci−1−) or whereby at least one signaling device is powered directly by its corresponding cell voltages V(Ci−1+) and V(Ci−1−). The supply voltage V(VCCi−1)−V(GNDi−1) of the output-stage (4), generated by the DC-DC voltage converter can be higher or lower then the cell-voltage V(Ci−1+)−V(Ci−1−). The corresponding input-stage of the device Cmi comprises adapted values for Rbi and Srci to guarantee correct operation of comparator (27) of device Cmi.

The invention also proposes a system for monitoring a plurality of power cells comprising a signaling system as proposed here above. In particular, such a monitoring system may comprise (FIG. 6):

a central monitoring device (29) and a series of decentralized monitoring devices, each monitoring device comprising a correspondent signaling device (CMi); and an isolator (30) to couple an output terminal of said central monitoring device to an input terminal (3) of the first monitoring device/signaling device CM1 and where the isolator (30) limits the voltage variations at the input terminal of the first monitoring device below the highest supply voltage of the first battery cell (V(C1⁺)) and above the lowest supply voltage of the first battery cell (V(C1⁻)).

The invention further relates to a signaling method for use with a plurality of power cells (Ci−1, Ci,) each cell having a different supply voltage interval ((V(Ci−), V(Ci+)) and each cell having its respective signaling device (CMi) and whereby each signaling device (CMi) is powered by the correspondent power cell (Ci), the signaling method comprising:

transmitting signals from an output terminal (4) of said (i−1)th signaling device (CMi−1) to an input terminal (3) of said ith signaling device (CMi);

characterized in that the method further comprises:

varying the electrical potential at said output terminal (4) of said (i−1)th signaling device (CMi−1) in dependence upon the signal to be transmitted;

limiting the variation of said electrical potential to the supply voltage interval [V(Ci−1⁻), V(Ci−1⁺)] of said (i−1)th signaling device; and sensing at the input terminal (3) of said ith signaling device (CMi), the variation of potential of said output terminal (4) of said i−1th signaling device (CMi−1), and for outputting a signal (28) which varies in dependence upon the sensed variation of potential.

According to an aspect of the invention, the method may comprise a limiting of the variation of said electrical potential at the input of a comparator (27) by means of a resistor and a current source.

The invention relates also to a method of monitoring a plurality of power cells, the method using a central monitoring device (29) and a series of decentralized monitoring devices, each decentralized monitoring device being coupled to a corresponding power cell and comprising its respective signaling device whereby the monitoring method further makes use of the signaling method described above.

According to the invention, the monitoring method may also comprise the step of determining the first monitoring device among the decentralized monitoring devices.

According to an aspect of the invention, such a monitoring method may also comprise the step of assigning an address to each of the decentralized monitoring devices.

According to an aspect of the invention, such a monitoring method may also comprise the step of updating a control bit in the address of each decentralized monitoring device.

DESCRIPTION OF ILLUSTRATIVE EMBODIMENTS

Figure 1:
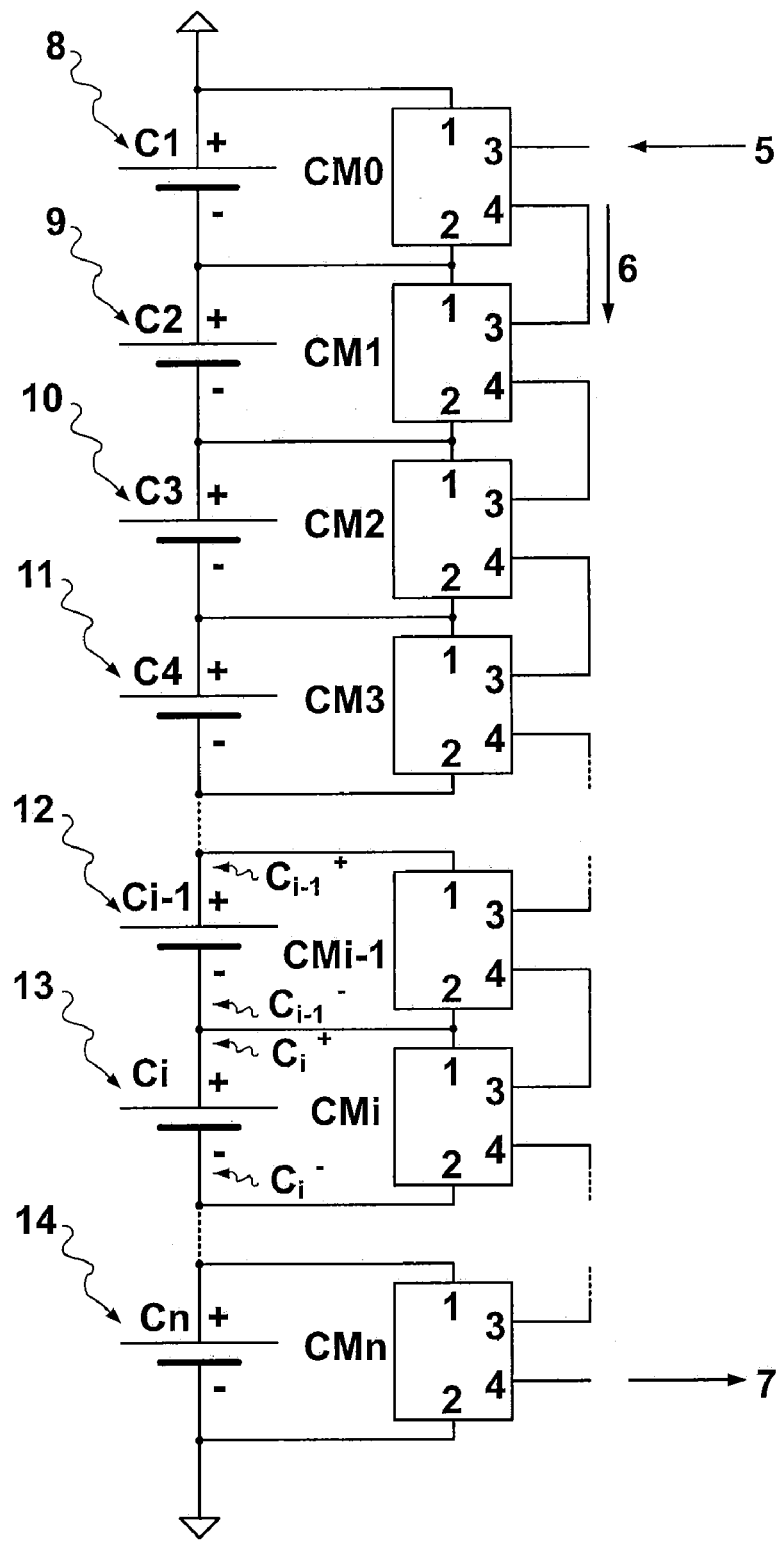
FIG. 1—Stack of batteries/power cells and daisy chain of associated monitoring devices.

The present invention will be described with respect to particular embodiments and with reference to certain drawings but the invention is not limited thereto but only by the claims. The drawings described are only schematic and are non-limiting. In the drawings, the size of some of the elements may be exaggerated and not drawn on scale for illustrative purposes. The dimensions and the relative dimensions do not correspond to actual reductions to practice of the invention.

Moreover, the terms top, bottom, over, under and the like in the description and the claims are used for descriptive purposes and not necessarily for describing relative positions. It is to be understood that the terms so used are interchangeable under appropriate circumstances and that the embodiments of the invention described herein are capable of operation in other orientations than described or illustrated herein.

It is to be noticed that the term "comprising", used in the claims, should not be interpreted as being restricted to the means listed thereafter; it does not exclude other elements or steps. It is thus to be interpreted as specifying the presence of the stated features, integers, steps or components as referred to, but does not preclude the presence or addition of one or more other features, integers, steps or components, or groups thereof. Thus, the scope of the expression "a device comprising means A and B" should not be limited to devices consisting only of components A and B. It means that with respect to the present invention, the only relevant components of the device are A and B.

Similarly, it is to be noticed that the term "coupled", also used in the claims, should not be interpreted as being restricted to direct connections only. Thus, the scope of the expression "a device A coupled to a device B" should not be limited to devices or systems wherein an output of device A is directly connected to an input of device B. It means that there exists a path between an output of A and an input of B which may be a path including other devices or means.

The invention will now be described by a detailed description of several embodiments of the invention. It is clear that other embodiments of the invention can be configured according to the knowledge of persons skilled in the art without departing from the true spirit or technical teaching of the invention, the invention being limited only by the terms of the appended claims.

As seen in FIG. 1, we consider a stack of N series connected power cells C1 (8), C2 (9), C3 (10), C4 (11), Ci−1 (12), Ci (13), Cn (14). The power cells could be battery cells, photovoltaic cells, thermoelectric cells or fuel cells as well as any other device generating voltage or current. In particular the power cells are (electrochemical) batteries. For the sake of simplicity and without restricting the scope of this invention, we may assume that every power cell develops the same voltage difference (or electromotive force) VC between its negative electrode and its positive electrode. The power cells are stacked or in other words series connected to generate a voltage difference greater than that generated by a single power cell. For instance, in the example of FIG. 1, the negative electrode of the battery cell C1 (8) is connected to the positive electrode of battery cell C2 (9), the negative electrode of battery cell C2 (9) is connected to the positive electrode of battery cell C3 (10) and so on.

The power cells Ci are monitored by monitoring devices CMi, i.e. devices that may monitor one or several of the parameters characterizing a power cell Ci. e.g. its temperature, the difference of potential between its positive and negative terminals $Ci^+$ and $Ci^-$. In the following we will indiscriminately refer to those devices as monitoring nodes, monitoring devices, control or controlling devices, control or C m controlling nodes, slaves, and slave units. A monitoring device may monitor a single power cell (see FIG. 1) or a group of two or more adjacent power cells (see FIG. 3). For the present patent, when the word "cell" is used in the description or in the claims, then one or more cells are meant, whereby the different cells may be connected in series or in parallel, or in series parallel. The monitoring devices are supplied by the power cell or group of power cells they monitor, i.e. each monitoring device CMi draws power from the positive terminal $Ci^+$ and negative terminal $Ci^-$ of the power cell it monitors, or when it monitors a group of power cells elements, it draws power from the positive terminal at the highest potential and the negative terminal at the lowest potential in said group of power cells elements. In the following, we will identify the power cells in the stack by the index i. The ith power cell has its positive electrode connected to the negative electrode of the (i−1)th power cell and its negative electrode connected to the positive electrode of the (i+1)th power cell. The same index i will be used to designate the ith monitoring device and the ith power cell it monitors.

Figure 2:
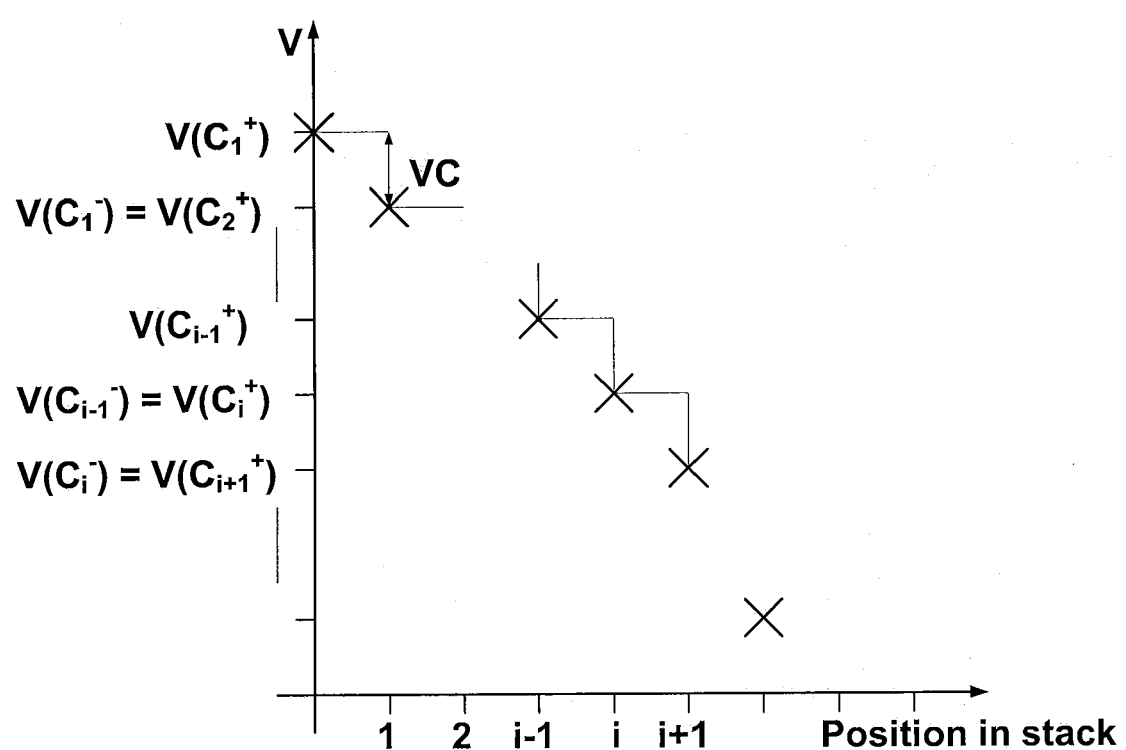
FIG. 2—Variation of voltages across the stack of batteries/power cells.
Figure 3:
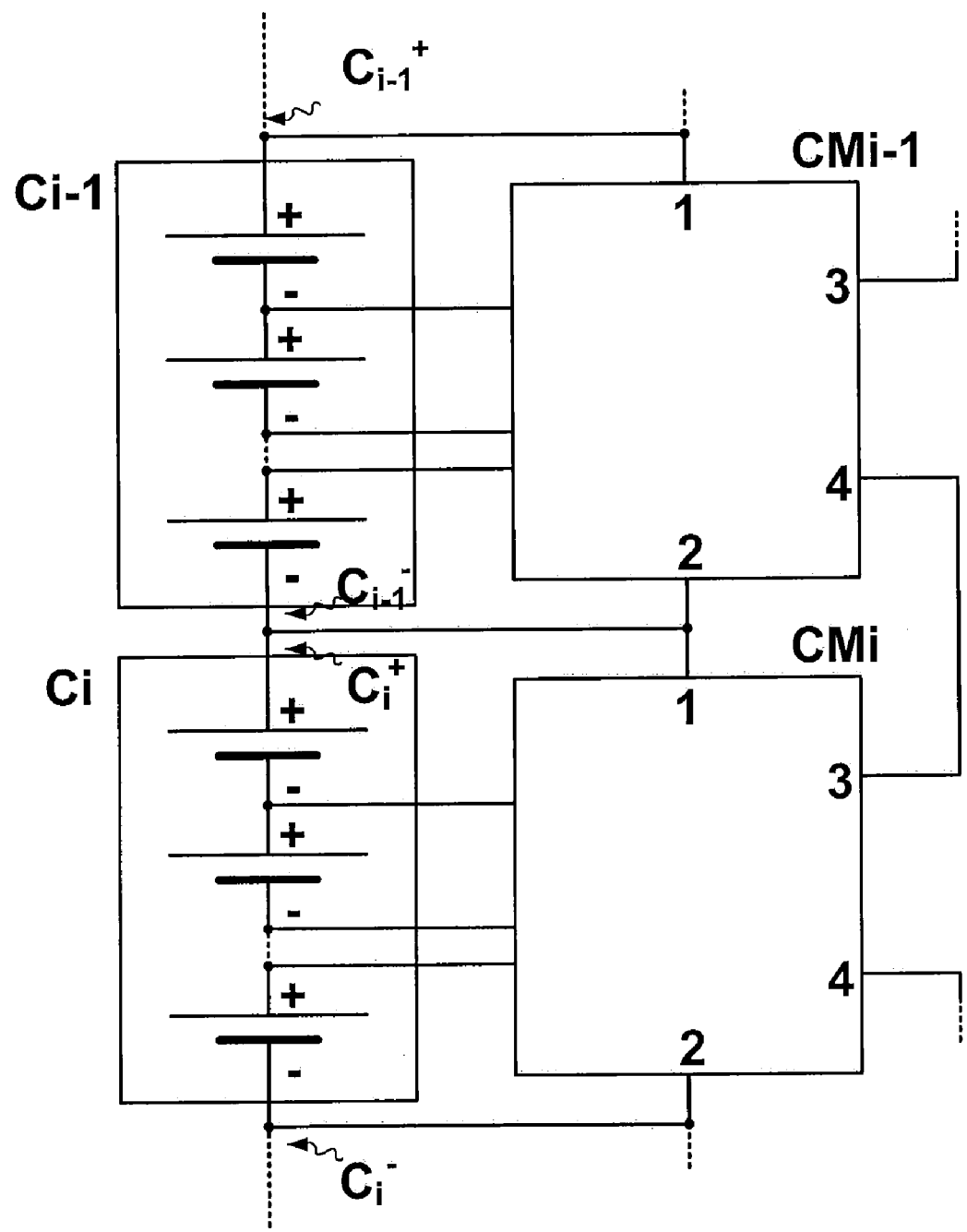
FIG. 3—Battery cells comprising two or more battery elements and associated monitoring devices.

If the ith monitoring node is monitoring a group of series connected power cell elements, the index i will designate that group of battery cells as can be seen in FIG. 3, $Ci^+$ the positive terminal at the highest potential in that group of power cell elements and $Ci^-$ the terminal at the lowest potential in that group of battery cells. $V(Ci^+)$ will thus be the potential of the positive supply of the ith monitoring device CMi and $V(Ci^-)$ the potential of the negative supply terminal of the ith monitoring device CMi. As seen in FIG. 2, the lowest the index i, the higher the potentials $V(Ci^+)$ and $V(Ci^-)$ i.e. $V(Ci^+) > V(Ci^-) = V(Ci+1^+) > V(Ci+1^-)$.

In addition to sensors or probing means required for the measurement of the parameters of a power cell, a monitoring device may contain actuators, in particular switches, capable of shunting a power cell (or a power cell element), logic or binary data processing means in the form of Digital Signal Processing unit and/or microprocessor and/or micro-controller and/or state machine and/or combinatorial logic. In the following we will refer to any such block as "logic." The monitoring devices may or may not contain analog data processing means in the form of analog filters, amplifiers, level shifters, as well as any other circuitry to generate a voltage or current reference, analog to digital converter (ADC) and/or digital to analog converter (DAC), DC-DC converter to generate auxiliary supply voltage(s). The monitoring devices comprise communication means to communicate the measured parameters to adjacent monitoring devices and/or a central management unit (micro-controller, micro-processor, computer).

Figure 4:
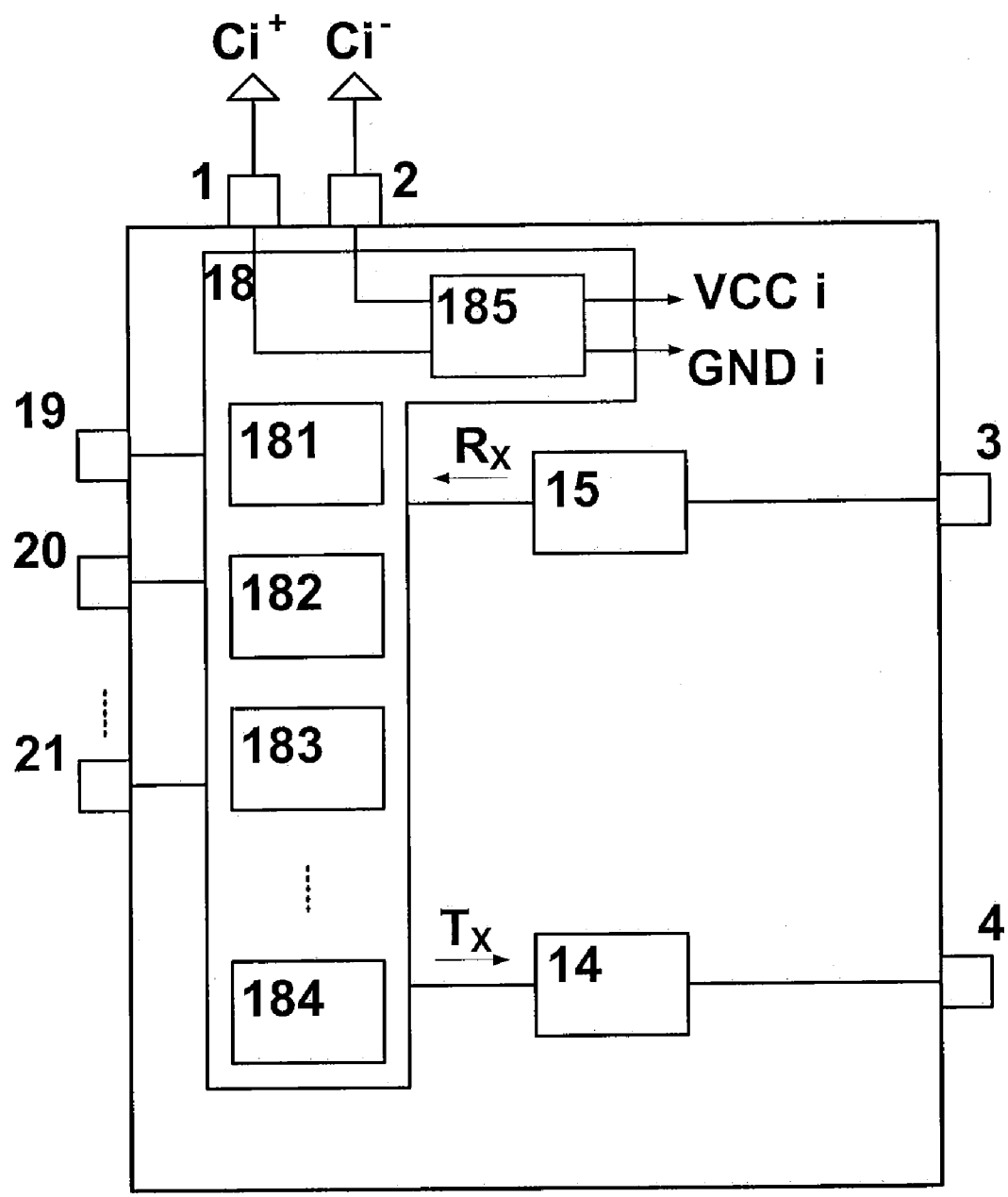
FIG. 4—Monitoring device.

An example of monitoring device can be found schematically in FIG. 4. The communication means of the monitoring device comprise an input port IN (3) to receive messages and an output port OUT (4) to send messages. Incoming messages on input port 3 are received by a receiver 15 converting the incoming signal into data Rx that can be interpreted by logic circuitry 181 included in the general analog and/or digital circuitry 18.

The signals generated within the general analog and/or digital circuitry 18 of a monitoring device often requires to be shared with other monitoring devices and/or a central management unit. These signals can be data Rx received by the logic circuitry 181 of an ith monitoring device and that must be relayed to other monitoring nodes and/or a central management unit 29. These signals can also be data generated on the monitoring node, data generated by house keeping circuitry 182 and pertaining to the monitoring node itself (address, status, results of self-test procedure(s), temperature), data acquired by a signal acquisition and processing block 183 within the monitoring node concerning signals generated by external sensors (not shown) and connected to the monitoring node by ports 19, 20, 21, or by internal sensors included in an internal sensor block 184 or data acquired by the signal acquisition and processing block 183 and related to the voltages $V(Ci^+)$ and $V(Ci^-)$ (and the voltage of intermediary nodes of the battery cell when a single monitoring device monitors two or more power cells elements as seen in FIG. 3). The outgoing messages corresponding to said signals are made available on the output port 4 through a transmitter 14. A DC-DC voltage converter 185 uses the voltages $V(Ci^+)$ and $V(Ci^-)$ to generate a supply voltage VCCi and provide a local reference ground voltage GNDi used to power the circuitry 18 and/or the receiver 15 and the transmitter 14. In a trivial case, there is no DC-DC converter and the circuitry is powered directly from $Ci^+$ and $Ci^-$, i.e. $VCCi=V(Ci^+)$ and/or $V(GNDi)=V(Ci^-)$. In some application, it may be advantageous to generate VCCi such that $V(Ci^-) < VCCi < V(Ci^+)$.

The problem with the transmission of data between monitoring devices originates in that said monitoring devices operate at different supply levels/different reference voltages. Let us for instance consider the transmission of a signal from an (i−1)th monitoring device CMi−1 and an ith monitoring device CMi: the (i−1)th monitoring device CMi−1 operates between the supply voltages $V(Ci-1^+)$ and $V(Ci-1^-)$ while the ith monitoring device CMi operates between the supply voltages $V(Ci^+)$ and $V(Ci^-)$. As discussed earlier, the prior art proposes to transmit signals (between two adjacent monitoring devices) through use of an open source MOSFET with the disadvantage that the voltage between drain and source of said MOSFET may be as high as $V(Ci-1^+)-V(Ci^-)$.

Figure 5:
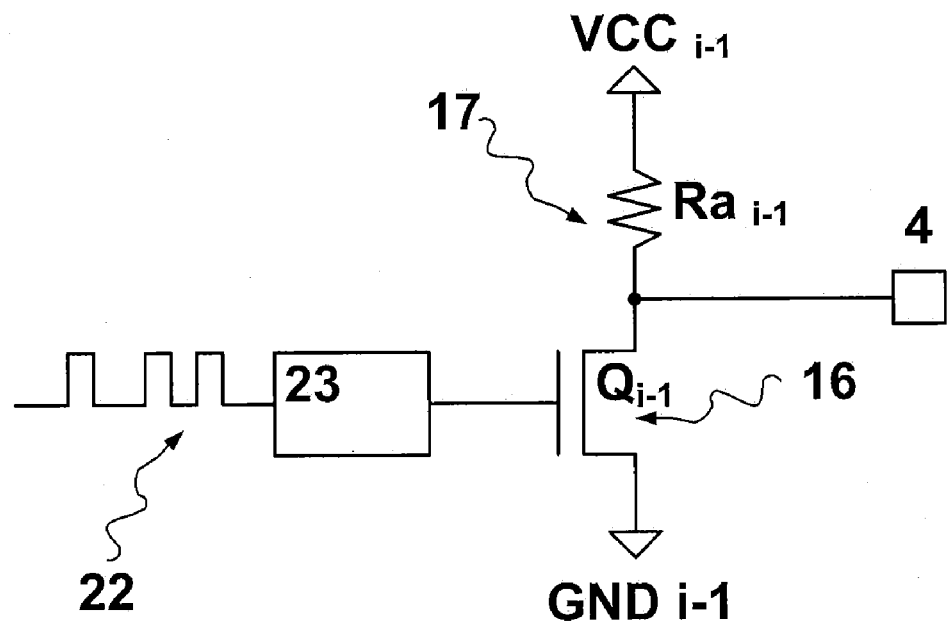
FIG. 5—Signaling means of the monitoring devices, receiver and transmitter.
Figure 5:
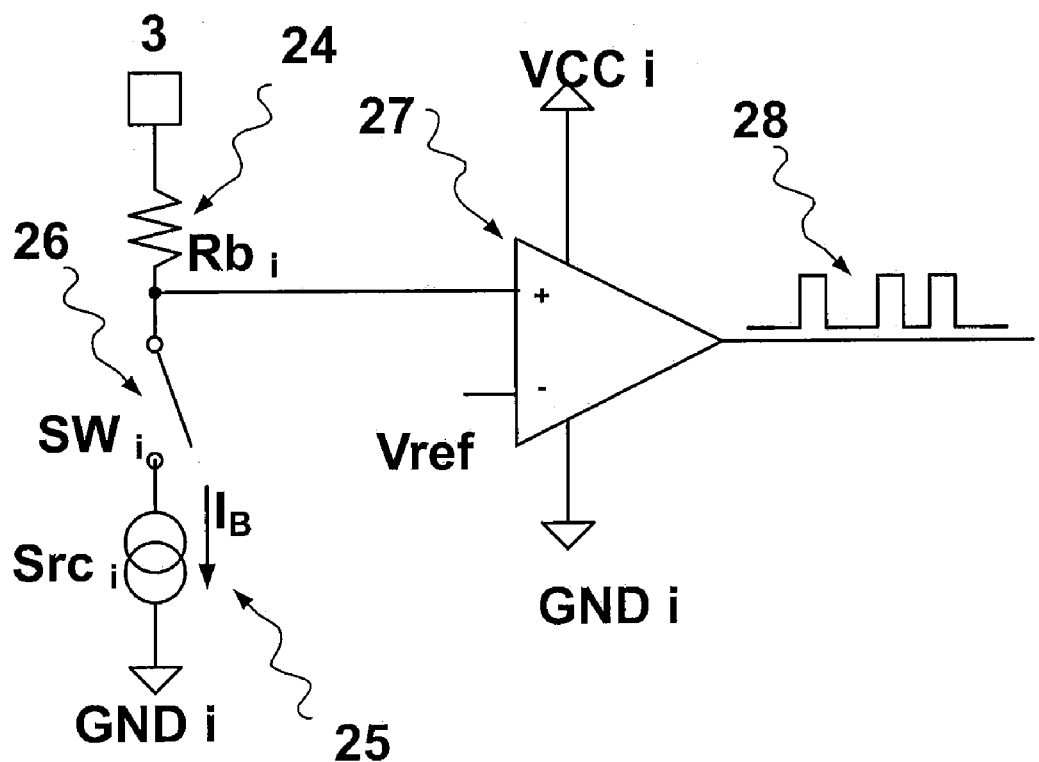

In the present invention, the transmitter 14 and the receiver 15 may be, for example, as shown in FIG. 5.

The transmitter 14 of an (i−1)th monitoring node CMi−1 comprises circuitry 23 that drives a switch, in particular a transistor switch Qi−1 16 that can be a field effect transistor (MOSFET or JFET) or a bipolar transistor. For the sake of clarity we will consider the particular case where the transistor switch Qi−1 16 is an n-type MOSFET. The source electrode of the n-type MOSFET transistor 16 is connected to the local GND supply i.e. GNDi−1. The drain electrode of the n-type MOSFET transistor Qi−1 16 is connected to the local supply voltage.

VCCi−1 through a pull-up resistor Ra i−1 17. Be R1 the resistance of resistor 17. The gate electrode of the n-type MOSFET transistor 16 is connected to circuitry 23 that converts signals 22 generated by general analog and/or digital circuitry 18 of the monitoring device into signals appropriate to drive the transistor 16. To that end, the circuitry 23 might be a single wire connecting the circuitry 18 to the control electrode of transistor 16 or it might be a circuit that will amplify and/or shape and/or buffer and/or shift the voltage level of the signals 22. The signals 22 are typically binary signals assuming either a lower voltage value L or a higher voltage value H, both lower voltage value and higher voltage value being within the interval [GNDi−1, VCCi−1]. Responding to a lower voltage value at its input, the circuitry 23 will apply to the gate of transistor 16 a voltage such that transistor 16 will be opened. In that case, the pull-up resistor 17 will pull the voltage on the output port 4 to a voltage higher than GNDi−1 but lower than VCCi−1. Responding to a higher voltage value at its input, the circuitry 23 will apply to the gate of transistor 16 a voltage such that transistor 16 will be closed. In that case, transistor 16 will force the voltage on the output port 4 to a voltage substantially equal to GNDi−1. The voltage signal generated on the output port 4 of the (i−1)th monitoring device CMi−1 is applied to the input port 3 of the ith monitoring device CMi through a conducting wire 6. The receiver block 15 of the ith monitoring node comprises a comparator 27 with a first and a second input, a current source 25 and a resistor 24. The comparator 27 is supplied by power supplies within the interval VCCi and GNDi.

The input port 3 of the ith monitoring device CMi is connected to a first input of the comparator 27 through a resistor Rb i 24. A reference voltage Vref higher than the potential of GNDi and lower than VCCi is applied to a second input of comparator 27. A current source Src i 25 forces a current $I_B$ through the resistor 24 (the switch SWi 26 is assumed to be closed). The resulting voltage on the first input of comparator 27 is equal to the voltage Vin of the input port 3 minus the voltage drop across the resistor 24, said voltage drop being proportional to the current $I_B$ and the resistance value R2 of resistor Rb i 24.

When the transistor switch Qi−1 16 of the (i−1)th monitoring device CMi−1 is open, the voltage Vin(i) at the input port 3 of the ith monitoring device CMi and the voltage V(+) (where V(+) is the voltage at a first input of the comparator 27 of the ith monitoring device CMi e.g. the + input as seen in FIG. 5) are such that the following equalities are satisfied:

$$VCC_{i-1} - R1 * I_B = Vin(i) \quad \text{Eq. 1}$$

$$Vin(i) - R2 * I_B = V(+) \quad \text{Eq. 2}$$

When the transistor switch Qi–1 16 of the (i–1)th monitoring device CMi–1 is closed, the voltage Vin(i) at the input port 3 of the ith monitoring device CMi and the voltage V(+) (where V(+) is the voltage at a first input of the comparator 27 of the ith monitoring device CMi e.g. the + input as seen in FIG. 5) are such that the following equalities are satisfied:

$$GND_{i-1} = Vin(i) \quad \text{Eq. 3}$$

$$Vin(i) - R2 * I_B = V(+) \quad \text{Eq. 4}$$

The current $I_B$, the resistance value of resistor 24 and the voltage Vref are chosen so that (a) the potential at the first input of comparator 27 e.g. V(+) will be lower than Vref when the transistor Qi–1 16 of the (i–1)th monitoring device CMi–1 is in a first of two states (open or closed) and (b) the potential at the first input of comparator 27 will be higher than Vref (but lower than VCCi) when the transistor 16 of the ith monitoring device is in a second of said two states (open or closed). In particular, the product $R2 \times I_B$ is taken equal to V(Ci+)–V(Ci–) (or V(VCCi)–V(GNDi)). The voltage at the first input of the comparator 27 is kept well within the voltage limit at which that comparator can operate without compromising proper operation and/or long term reliability, and the binary data Rx 28 generated at the output of comparator 27 varies within a voltage interval that is compatible with the general analog and/or digital circuitry 18 of the device CMi. In particular, under the assumption that the voltage difference V(Ci⁺)–V(Ci–) (or V(VCCi)–V(GNDi)) has substantially the same value VC for every monitoring node, the current $I_B$ and the resistance value R2 of resistor 24 and R1 of resistor 17 are chosen so that the voltage drop across resistor 24 is substantially equal to VC and the voltage drop across resistor 17 is small compared to VC. In that case, for the ith monitoring device, V(+) will vary from substantially V(GNDi) when the transistor Qi–1 16 is closed to substantially VCCi when the transistor Qi–1 16 is open. Another consequence for that choice of resistance R2 and current $I_B$ is that the voltage at the input port (3) of the monitoring device CMi (equal to the voltage at the output port (4) of the monitoring device CMi–1) will never be lower than VCCi=GNDi–1 when the switch Qi–1 16 of the (i–1)th monitoring device CMi–1 is open. Therefore, based on equation Eq. 1, Eq. 2, Eq. 3 and Eq. 4 and the condition $R2 \times I_B = VC$, the voltage at the output (4) of the (i–1)th monitoring device will vary between GNDi–1 and a voltage substantially equal to VCCi–1 (strictly speaking this voltage will be equal to VCCi–1–R1×IB as can be deducted from equation 1).

Figure 11:
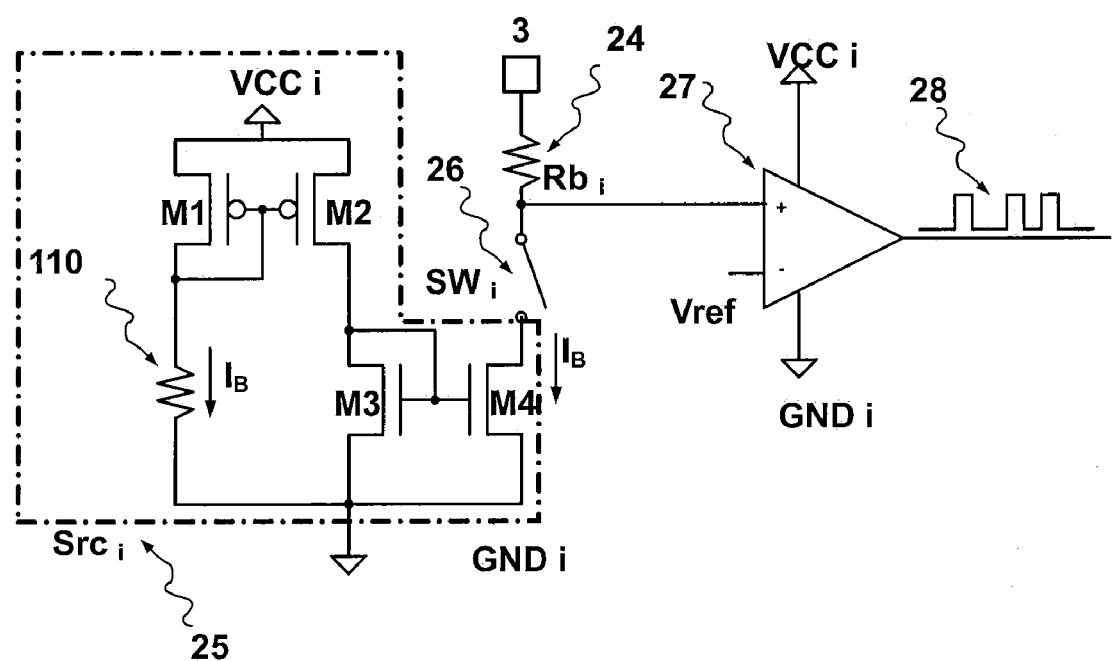
FIG. 11—Signaling means of the monitoring devices: a transmitter arrangement

The condition R2×IB=VC is advantageously realized with a current source Srci 25 as seen on FIG. 11. The reference bias current IB is generated with a MOSFET transistor M1 and a resistor 110 that has the same resistance R2 as resistor $Rb_i$. Transistor M1 is connected in diode manner and is connected in series with the resistor R1 between VCCi and GNDi. The current in the resistor 110 is equal to (VCCi–VDS–GNDi)/R2 where VDS is the voltage drop between drain and source of transistor M1. In a first approximation, that current will be equal to (VCCi–GNDi)/R2. The current is mirrored through transistor M2 and M3 to transistor M4. When the switch Swi 26 is closed, transistor M4 acts as current source and forces the current IB to flow through resistor Rbi 24. Assuming that the mirror ratio B1 of transistor M1 and M2 is 1 and the mirror ration B2 of transistor M3 and M4 is 1 as well, the current IB in transistor M4 is equal to the current in the resistor 110. The voltage drop across the resistor 24 will then be equal to R2×(VCCi–VGNDi)/R2=VCCi–GNDi. Even if the supply voltage VCCi fluctuates, the voltage drop across the resistor 24 Rbi will always be equal to VCCi–GNDi. This result would be very difficult if not impossible to achieve with a resistive divider as proposed in the art. In this description of the current source Srci 25, we have assumed that the resistor 110 and the resistor Rbi 24 had the same resistance R2. In that case, one has to assume that the mirror ratio B1 for transistors M1 and M2 on one hand and the mirror ratio B2 for transistors M3 and M4 on the other hand is 1. Mirror ratios B1 and B2 may be different from one but in that case, the resistance of resistor 110 must be equal to R2*B1*B2 to guarantee that R2×IB=(VCCi–GNDi).

With the proposed transmitter 14 and receiver 15, the voltage difference between a first and a second main electrode of transistor Qi–1 16 is kept below VC (i.e. the transistor 16 is not exposed to electrical stress that would affect proper operation and/or long term reliability) as can be seen from Equations 1 to 4 here above. The voltage at the output port 4 of every monitoring node CMi will remain within the interval [V(Ci⁻), V(Ci⁺)]. Surprisingly, this means that the monitoring devices CMi according to this invention send data in a fashion compatible with communication protocols known to the art, in particular the LIN protocol, without the need for optocouplers between the monitoring devices CMi–1 and CMi. This also implies that the supply-current related to the transmitter will be the same for all outputs (4) because all outputs will have the same voltage-swing.

We will now see that the transmitter 14 and receiver 15 described here above can be used advantageously to identify the first monitoring device CM1 in a series of daisy chained monitoring devices CMi.

As discussed earlier, in some cases data must be exchanged not only between monitoring devices but also between the monitoring devices and a central management unit 29. Assuming that the central management unit shares at least one supply voltage with one of the monitoring devices, the data management unit could use the transmitter 14 and/or the receiver 15 to exchange data with the first or the last monitoring device. In particular, one of the monitoring devices on FIG. 1 could assume the role of a central management unit in addition to its role as a monitoring device.

In most cases however, the central management unit will not have a common supply with any of the monitoring devices or it will not be practical to impose that data be exchanged between the central management unit and a monitoring device without isolator. This will be the case for instance when the monitoring devices are mass produced and substantially identical, i.e. the resistance value R1 and R2 of resistor 17 and 24 and the current $I_B$ sourced by current source 25 remaining substantially unchanged from monitoring device to monitoring device.

Figure 6:
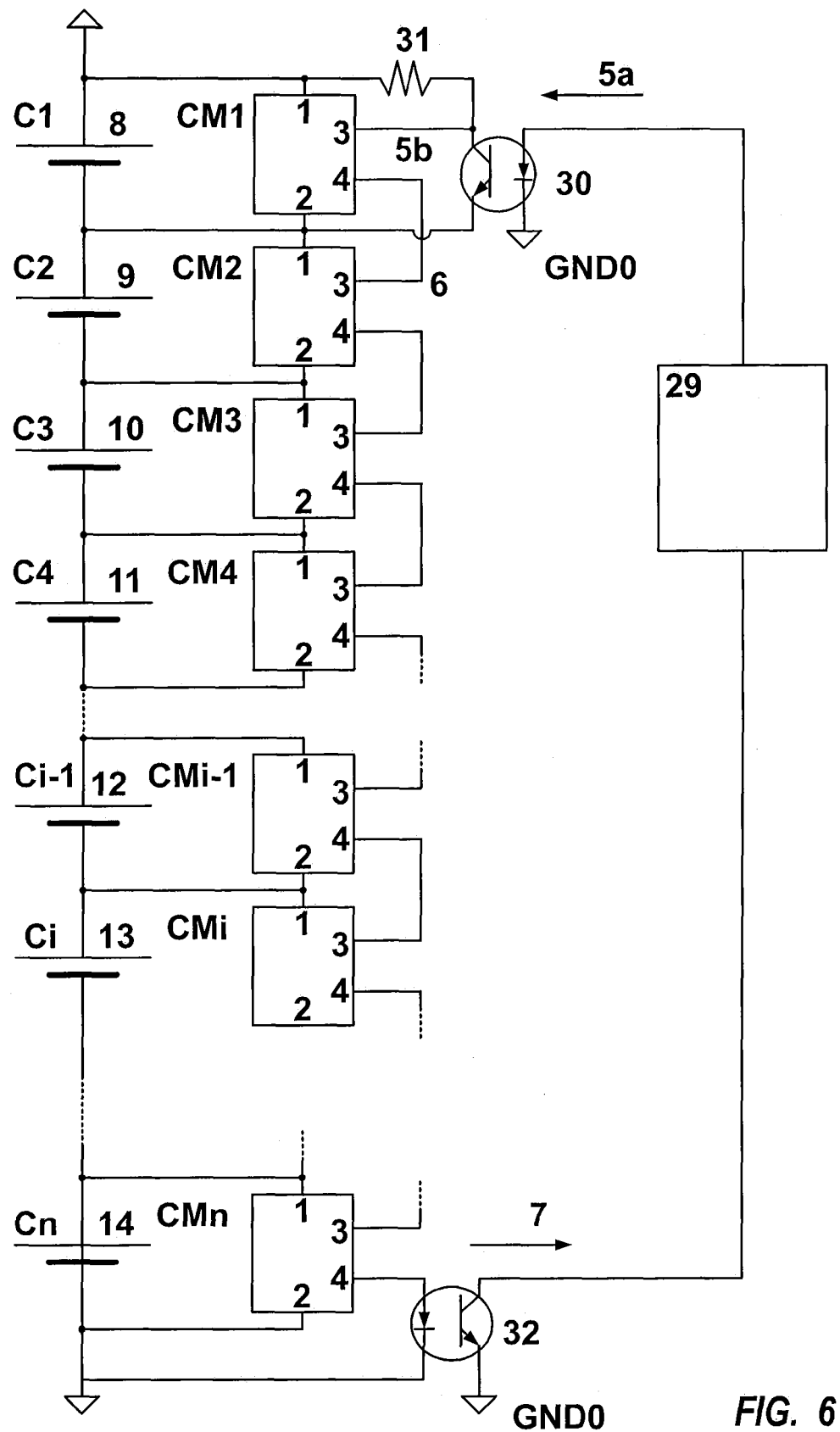
FIG. 6—Battery monitoring system with central monitoring unit.

As seen on FIG. 6, the monitoring unit CM1 associated with the battery cell C1 (8) receives data (5a, 5b) from a central management unit 29 that drives an opto-coupler 30 (the coupler 30 could also be any other electrical isolator-couplers based on e.g. optical or magnetic interconnection). A pull-up resistor 31 (connected to C1⁺ or as proposed below to VCC1) is necessary for the proper operation of the opto-coupler 30. A second opto-coupler 32 is driven by the last monitoring device to allow it to send data to the central data management unit 29. Information can be send from the central data management unit 29 to any monitoring device CMi by transiting through CM1, CM2, CMi−1. Data can be send from any device CMi and reach the central data management unit 29 by transiting through CMi+1, Cn and the opto-coupler 32.

When the current level of the data signals 5a vary between a lower value and a higher value (sufficient to deactivate or activate the opto-coupler 30) as is the case when digital data is sent by the central management unit 29, current will not flow or flow through the pull up resistor 31. As a result the voltage on the input port 3 of the monitoring unit CM1 associated with the battery cell 8 varies from a voltage substantially equal to the supply V(C1+) of that monitoring device to a voltage substantially equal to GND1. This will be true whether the switch 26 from the receiver 15 of CM1 is open or closed.

As described above, the voltage on the output port 4 of every ith monitoring device in the daisy chain will vary between GNDi and VCCi, this means that the voltage seen at the input port 3 of every ith monitoring device in the daisy chain will vary between a first voltage equal to GNDi−1=VCCi and a second voltage higher than VCCi. In particular, with R1<R2 and R2×$I_B$=VC, the voltage seen at the input port 3 of every (i+1)th monitoring device in the daisy chain will vary between a first voltage substantially equal to GNDi=VCC(i+1) and a second voltage substantially higher than VCC(i+1). Hence, with the proposed invention, if the voltage at which data is received on the input port 3 of monitoring device CMi does not exceed VCCi (or V(Ci$^+$), the device CMi is the device CM1, first in the daisy chain of devices CMi, operating at the highest supply voltage V(C1$^+$) and associated with the first power cell C1. If the voltage at which data is received on the input port 3 of monitoring device CMi exceeds VCCi when data is transmitted, the device CMi is not the first in the daisy chain of devices CMi.

Figure 7:
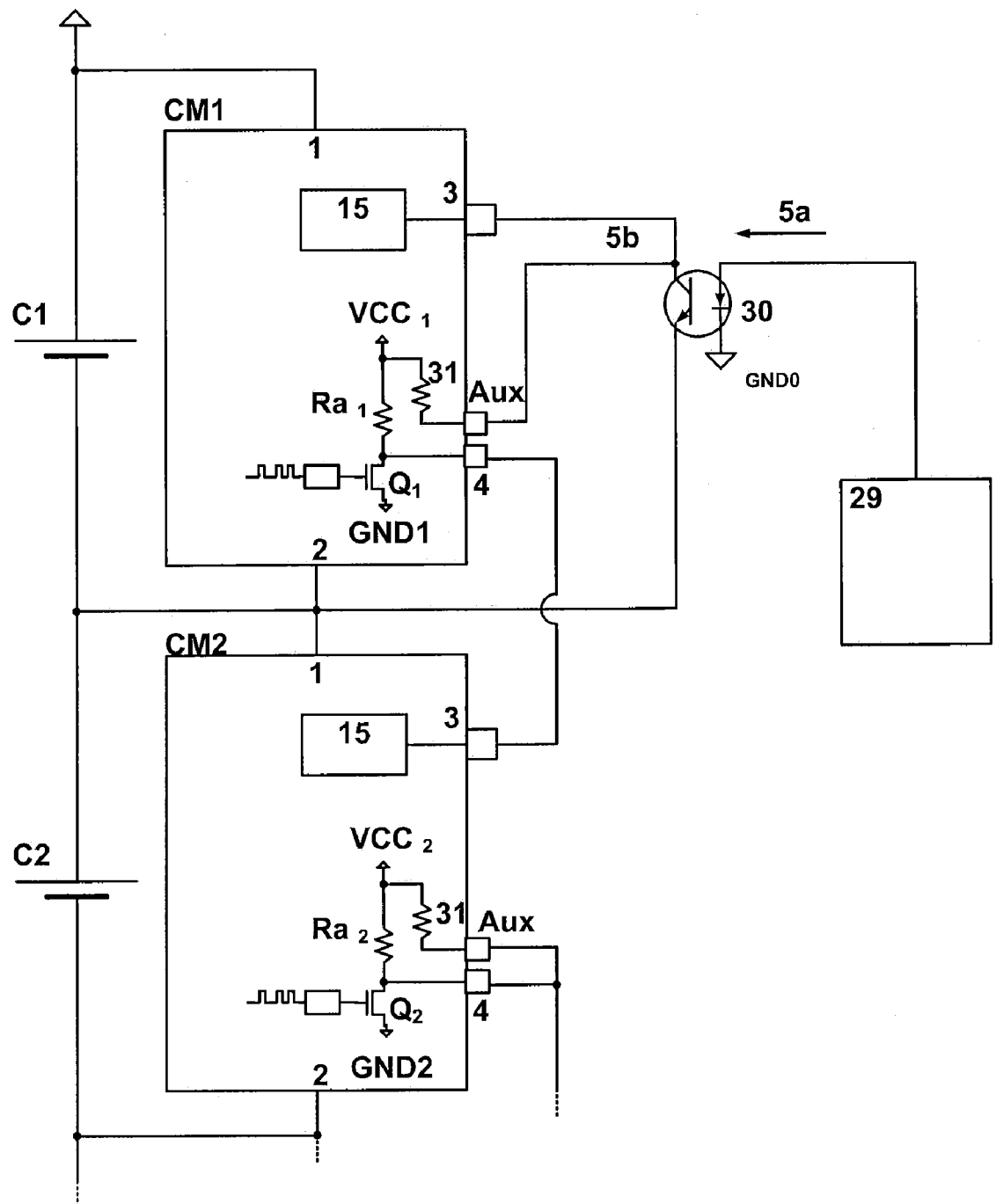
FIG. 7—Equal loading of the battery cells.

To avoid that the power cells Ci be loaded differently, a resistor may be used in parallel with the pull-up resistor Rai (17) of every monitoring device CMi that is not the first. This situation is illustrated on FIG. 7 where the pull-up resistor 31 is connected to VCCi. For CM1, the resistor 31 is used for the opto-coupler (30). This implementation makes sure that any monitoring device CMi will have the same load for Ci. For all CMi, the pull-up resistors will see the same voltage difference V(Ci) independent of the cell C1 or any other cell. When the monitoring devices are integrated circuits, resistor 31 is connected to VCCi and an auxiliary port "Aux". When daisy chained, the Aux port of the first device CM1 is connected to the opto-coupler 30 (as shown on FIG. 7). For the other monitoring devices, the auxiliary port ios shorted with the output port 4 (see FIG. 7).

In the following, we will assume that when a monitoring device CMi does not know whether it is the first monitoring device CM1 or not, the switch 26 of the receiver 15 of that monitoring device is open.

Figure 8:
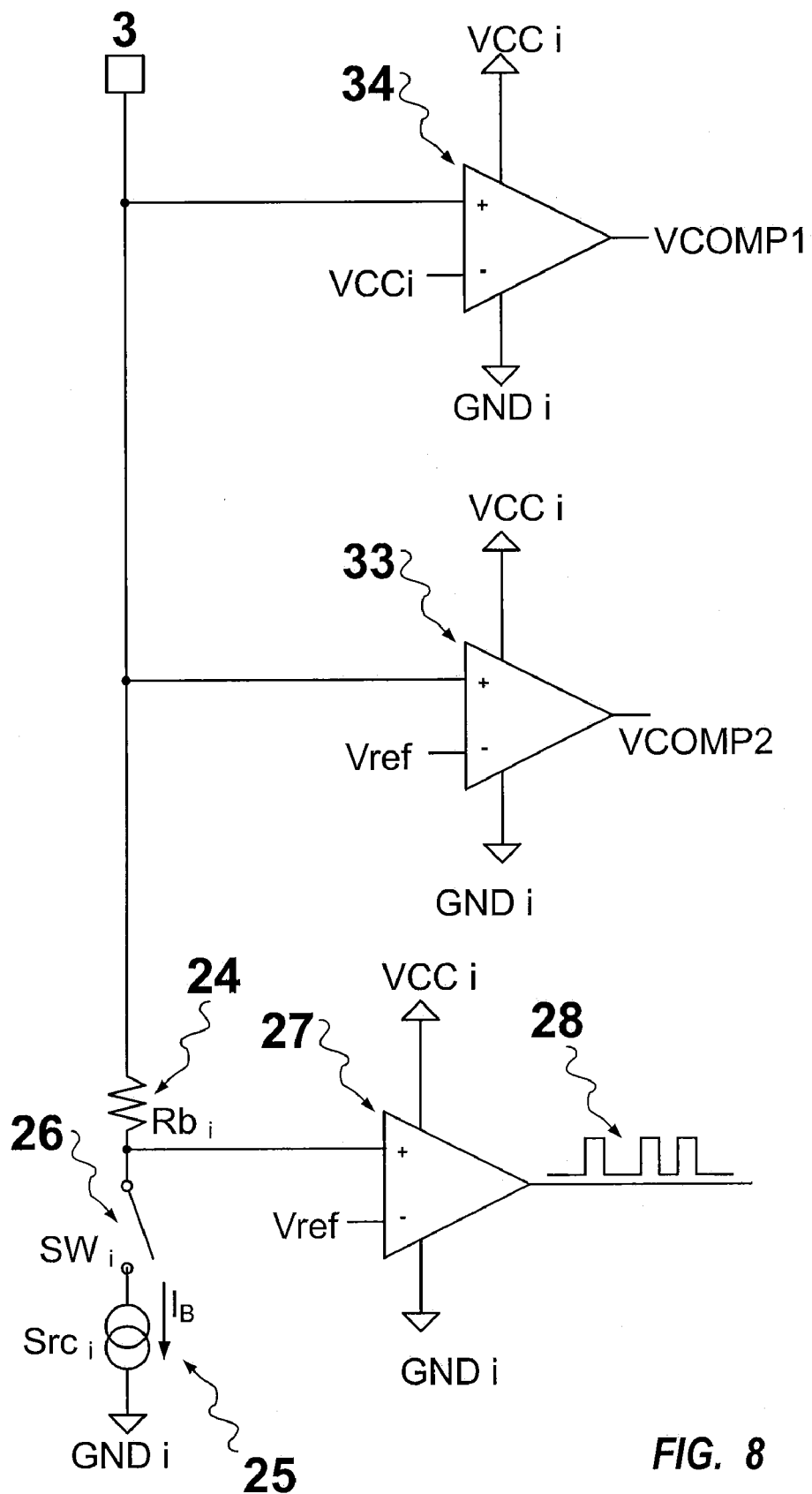
FIG. 8—Monitoring of the signal levels for identification of the first monitoring device CM1.

Two additional comparators 34 and 33 (see FIG. 8) may be used to monitor the voltage Vin(i) on the input port (3) of the ith monitoring CMi device.

Comparator 34 compares Vin(i) with VCC(i) (alternatively it compares the result to VCCi+ΔV where 0<ΔV<VC). This can be done for instance by dividing the input Vin(i) with a resistive divider and comparing the result with a divided (with the same ratio) version of VCCi (or VCCi+ΔV), or any other method or circuit known from the art. Be VCOMP1 the result of the comparison made by comparator 34.

Comparator 33 compares Vin(i) with a reference voltage Vref such that GNDi<Vref<VCC(i). Be VCOMP2 the result of the comparison made by comparator 33. For CM1, the output of COMP1 will always be low: indeed Vin(1) is always≦VCC1 (hence it is smaller than VCC1+ΔV).

For CM1, the output of COMP2 will vary between a low state L and high state H indicating that data is being received by CM1.

For CM1, the switch SW1 (26) remains open and no current IB is forced through the resistor Rb1. The voltage at the inputs of comparator (27) varies between GND1 and VCC1.

For any monitoring device CMi other than CM1, the output of COMP2 will vary between L and H indicating that data is being received by CMi and the output of COMP1 will also vary between L and H: indeed Vin(i) (it 1) varies between GNDi−1=VCCi<VCCi+ΔV and VCCi−1≈VCCi+VC>VCCi+ΔV (the switch SWi 26 being open, no substantial current is forced through the pull-up resistor Ra i−1).

When data is received as indicated by COMP2 and when the voltage at the input port (3) of the device CMi varies between GNDi−1=VCCi and a value higher than VCCi as indicated by COMP1, the switch SWi (26) is closed. Once the switch SWi (26) is closed, the current IB is forced through resistor Rbi (24), Vin(i) is level shifted by the amount R2×IB (e.g. R2×IB≈VC) and the voltage at a first input of comparator 27 varies between GNDi and VCCi (which is compatible with the LIN communication protocol).

The combination of the signals VCOMP1 and VCOMP2 that will determine whether or not the monitoring device CMi is the first in the daisy chain and whether or not to close the switch SWi (26) (to force current through resistor Rbi 24) is done by any appropriate logic circuitry according to techniques known to the art (an example of such circuit will be given below).

As discussed earlier, it is interesting to be able to give an address to a monitoring device after an entire system has been assembled and not have to give an address before or during fabrication of the monitoring devices and/or assembly of the entire battery monitoring system. For instance, in WO 00/05596 a unique address is given to each monitoring device through use of a dip switch that is manually configured. If most of the monitoring device has been integrated in a semiconductor chip, the use of dip switch would also imply additional dedicated connection pins on that chip that are not always desired or even not available.

Once the first monitoring device in the daisy chain is known, it is assigned an address by a master e.g. a central data management unit 29 or assigns itself a first address. Addressing the other monitoring devices may then proceed in a number of ways known to the art. For instance, once a monitoring device is known to be the first/knows that it is the first, it may proceed by issuing a message to the next monitoring device to signal that device that it is the second in the daisy chain. That second monitoring device may then proceed by issuing a message to the next monitoring device to signal that device that it is the third in the daisy chain and so on.

For another embodiment of the invention, the address assignment can happen under the control of the central data management unit 29. For this embodiment, the central data management unit will issue the required messages to assign the address to the different monitoring devices.

E.g. at start-up no monitoring devices will have an address and will not communicate the received data at input (3) to their output (4). At start-up, the command of the central data management unit 29 will only arrive at the first monitoring device and will get its address. Once the address is assigned, the monitoring unit will enable its output (4) so that the next messages will also arrive at the next monitoring unit. The next message of the central data management unit 29 can assign the address to the next monitoring unit. Repetition of these steps will assign an address to every monitoring module and will close the communication loop though the last monitoring unit CMn.

Since the order of the monitoring devices corresponds to the order of the battery/power cells in the stack of battery/power cells, it is possible to associate the information of an ith monitoring node to the ith battery/power cells it monitors.

The address of each node is important for the proper operation of the monitoring system and in particular it is of utmost importance to clearly identify which node is the first and which nodes are not first in the daisy chain; failure to do so might prevent reception of an incoming message. Indeed, if a node is incorrectly identified as first in the daisy chain, the switch Swi 26 (see FIG. 8) will not be activated and the output of comparator 27 will never vary. If the first node in the daisy chain is incorrectly considered to be further in the daisy chain (i.e assumed not to be the first), the switch Sw1 will be activated, the input of comparator 27 will be stuck to GND1 and the output of comparator will not vary either.

Be FIRSTB a control bit found in every node of the daisy chain. FIRSTB is High if the node is not the first node in the daisy chain. FIRSTB is low if the node is first in the daisy chain.

The switch Swi 26 is closed if FIRSTB is high and the Swi 26 is open if FIRSTB is low.

When the battery monitoring system is started and the nodes have not yet been issued an address, FIRSTB is set to low by default and the switch Swi 26 is open for every node in the daisy chain.

Let us consider the particular case where the recessive bit on the input port 3 is the high state on that port 3. The switch Sw1 26 being open in the first node, when data is received, the voltage on the input 3 will vary from VCC1 to GND1 i.e. the input port 3 of the node sees a negative edge transition. The output of comparator COMP1 34 remains at GND1 and the output of comparator COMP2 33 varies from VCC1 to GND1. FIRSTB has to remain low.

Let us now consider the case of a node that is not first in the daisy chain. This time, the voltage at the input 3 will vary between VCCi+VC and VCCi (the switch Swi 26 is not closed when FIRSTB is low). The output of the comparator COMP1 34 for that node varies from high to low and the output of comparator COMP2 33 remains high. FIRTSB has to be set to high to activate the switch Swi 26 in that node and allow reception of the incoming data by comparator 27 in that node.

Figure 9:
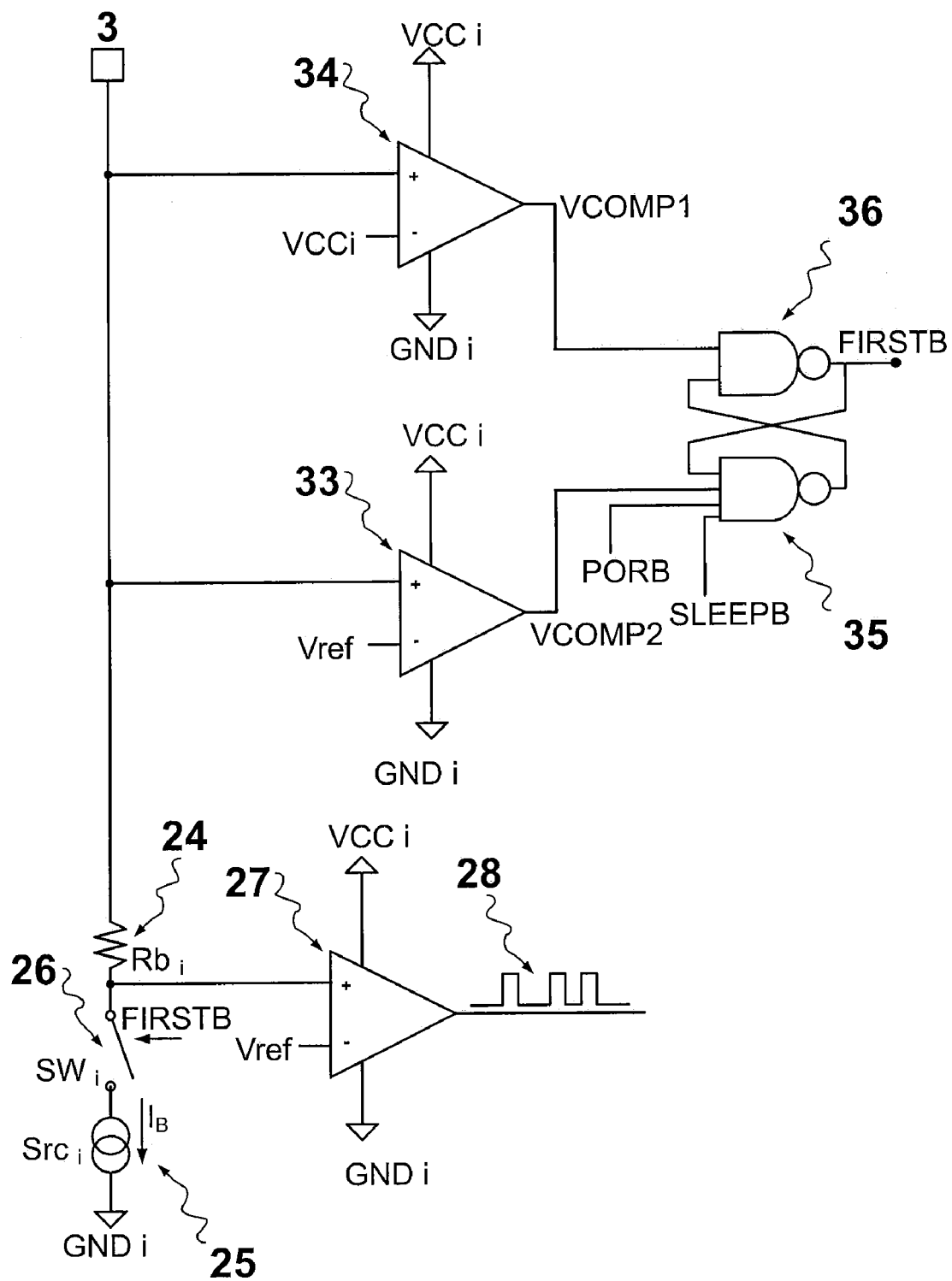
FIG. 9—Circuit for updating a control bit of an address.

A possible implementation of a logical circuit that will update the value of FIRSTB accordingly is given on FIG. 9. A first 2 input NAND gate 36 and a second three input NAND gate 35 are connected as an RS flip-flop. One of the input of the NAND gate is driven by a power on reset signal that will initialize FIRSTB to Low. The state of FIRSTB might be altered by a disturbance during operation of the system. This would prevent the node for which the value of FIRSTB has been altered to properly receive data. The disturbance might for instance be caused by an ionizing radiation or by a neutron that will interact with the semiconductor substrate and generate a cascade of charged particles. The origin of the ionizing radiation or neutron may be artificial or natural (cosmic rays for instance). The disturbance can also be caused by EMC-disturbance e.g. RF-signals that are received by the connection 6 (see e.g. FIG. 1) between 2 cells.

Let us consider what would happen for a node that is not the first in the daisy chain when the value of FIRSTB is upset (i.e. modified from High to Low), the switch Swi 26 for that node is opened after the upset. When data will arrive, the transition from VCCi+VC to VCCi on the input port will update the value of FIRSTB from Low to High.

Figure 10:
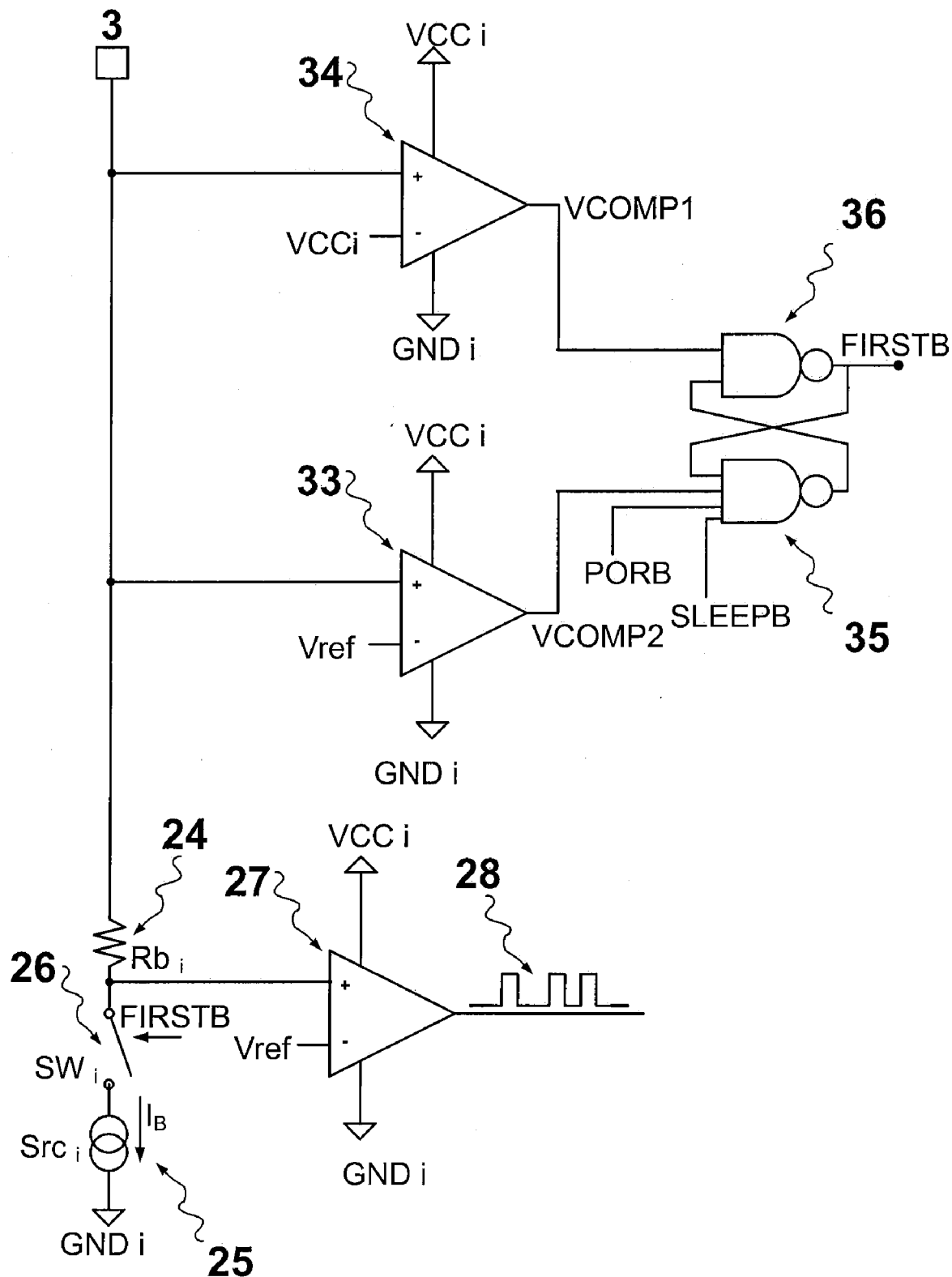
FIG. 10—Circuit for correcting the control bit in an address

Let us consider what would happen for a node that is the first in the daisy chain when the value of FIRSTB is upset (i.e. modified from Low to High), the switch Swi 26 for that node is closed and the voltage on the input of comparator 27 will remain stuck at GND1. Both the output of COMP1 and COMP2 will remain stuck in a Low state as well. In this case, no incoming data can be used to update the value of FIRSTB as was done for the other nodes in the daisy chain. To correct this, in every node, a timer (not shown) can be reset every time that activity is seen in the LIN. Once the timer indicates that a time interval $\Delta T_{Max}$ has elapsed without any activity on the input 3, FIRSTB is modified from High to Low, which brings the node back to the situation it was in at start-up, i.e. the node considers itself to be first in the line and the switch Swi 26 is opened. By construction, the output of COMP1 and COMP2 may never be High at the same time. The output signal SLEEPB of the timer considered here above could for instance be applied to a fourth input of the second NAND gate 35 (see FIG. 10 which shows a circuit for correcting the control bit).

The invention claimed is;

1. A signaling system for use with a plurality of power cells each cell having a different supply voltage interval ((V(Ci−), V(Ci+)) and each cell having its respective signaling device, and whereby each signaling device is powered by the correspondent power cell, the signaling system comprising:

at least, an (i−1)th and an ith signaling device;

a communication link for transmitting signals from an output terminal of said (i−1)th signaling device to an input terminal of said ith signaling device;

said communication link consisting of an electrical conducting connection;

wherein said (i−1)th signaling device comprises means for varying the electrical potential at said output terminal in dependence upon the signal to be transmitted; and said ith signaling device comprises means for sensing, via said communication link and said input terminal, the variation of potential of said output terminal and for outputting a signal which varies in dependence upon the sensed variation of potential and said ith signaling device further comprises means for limiting the variation of electrical potential at the output terminal of the (i−1)th signaling device to the supply voltage interval [V(Ci−1$^−$), V(Ci−1$^+$)] of said (i−1)th signaling device.

2. A signaling system according to claim 1 whereby at least one signaling a device is powered by a supply voltage (VCCi) and a local ground voltage (GNDi), the supply voltage and the ground voltage being generated by a DC-DC voltage converter using the cell voltages (V(Ci+) and V(Ci−)) or whereby at least one signaling device is powered directly by its corresponding cell voltages V(Ci+) and V(Ci−).

3. A signaling system according to claim 1 wherein the means for limiting the variation of electrical potential at output terminal of the (i−1)th signaling device comprise a resistor and a current source.

4. A signaling system according to claim 3 whereby at least one signaling device is powered by a supply voltage (VCCi) and a local ground voltage (GNDi), the supply voltage and the ground voltage being generated by a DC-DC voltage converter using the cell voltages (V(Ci+) and V(Ci−)) or whereby at least one signaling device is powered directly by its corresponding cell voltages (V(Ci+) and V(Ci−)).

5. A system for monitoring a plurality of power cells comprising a signaling system according to claim 1.

6. A system for monitoring a plurality of power cells according to claim 5 comprising:

a central monitoring device and a series of decentralized monitoring devices, each monitoring device comprising a correspondent signaling device; and an isolator to couple an output terminal of said central monitoring device to an input terminal of the first monitoring device having the signaling device and where;

the isolator limits the voltage variations at the input terminal of the first monitoring device below the highest supply voltage of the first battery cell ($V(C1^+)$) and above the lowest supply voltage of the first battery cell ($V(C1^-)$).

7. A signaling method for use with a plurality of power cells, each cell having a different supply voltage interval (($V(Ci-)$, $V(Ci+)$)) and each cell having its respective signaling device and whereby each signaling device is powered by the correspondent power cell, the signaling method comprising:

transmitting signals from an output terminal of said (i−1)th signaling device to an input terminal of said ith signaling device;

wherein the method further comprises:

varying the electrical potential at said output terminal of said (i−1)th signaling device in dependence upon the signal to be transmitted; and limiting the variation of said electrical potential to the supply voltage interval [$V(Ci-1^-)$, $V(Ci-1^+)$] of said (i−1)th signaling device;

sensing at the input terminal of said ith signaling device, the variation of potential of said output terminal and for outputting a signal which varies in dependence upon the sensed variation of potential.

8. A signaling method according to claim 7 whereby the limiting of the variation of said electrical potential is done by means of a resistor and a current source.

9. Method of monitoring a plurality of power cells, the method using a central monitoring device and a series of decentralized monitoring devices, each decentralized monitoring device being coupled to a corresponding power cell and comprising its respective signaling device, the method further using the signaling method according to claim 7.

10. Method of monitoring a plurality of power cells according to claim 9, the method further comprising the step of determining the first monitoring device among the decentralized monitoring devices.

11. Method of monitoring a plurality of power cells according to claim 10, the method further comprising the step of assigning an address to each of the decentralized monitoring devices.

12. Method of monitoring a plurality of power cells according to claim 11, the method further comprising the step of updating a control bit in the address of each decentralized monitoring device.

* * * * *